United States Patent [19]
Campi, Jr.

[11] Patent Number: 5,529,819
[45] Date of Patent: Jun. 25, 1996

[54] PELLICLE ASSEMBLY WITH VENT STRUCTURE

[75] Inventor: James G. Campi, Jr., Morgan Hill, Calif.

[73] Assignee: Inko Industrial Corporation, Sunnyvale, Calif.

[21] Appl. No.: 425,031

[22] Filed: Apr. 17, 1995

[51] Int. Cl.⁶ .................. G03F 1/00; G03F 9/00
[52] U.S. Cl. .................. 428/14; 428/131; 355/30
[58] Field of Search ............... 428/14, 131, 138; 355/122, 30

[56] References Cited

U.S. PATENT DOCUMENTS

| | | | |
|---|---|---|---|
| 4,697,701 | 10/1987 | Ying | 206/316 |
| 4,737,387 | 4/1988 | Yin | 428/14 |
| 4,833,051 | 5/1989 | Imamura | 436/5 |
| 5,305,878 | 4/1994 | Yen | 206/316.1 |
| 5,344,677 | 9/1994 | Hong | 428/14 |

*Primary Examiner*—Alexander S. Thomas
*Attorney, Agent, or Firm*—Flehr, Hohbach, Test, Albritton & Herbert

[57] ABSTRACT

A pellicle for isolating a photomask pattern from particulate contaminants. The pellicle includes a peripheral frame having at least one vent structure for the passage of a gaseous substance between the interior of the frame and the atmosphere outside of the frame. The vent structure is configured for removal of particulate contaminants from the gaseous substance before the gaseous substance flows into the interior of the frame. The vent structure includes at least one exterior passageway extending between two openings in the outer surface of the frame and at least one interior passageway extending inwardly from the exterior passageway to an opening in the inner surface of the frame.

18 Claims, 2 Drawing Sheets

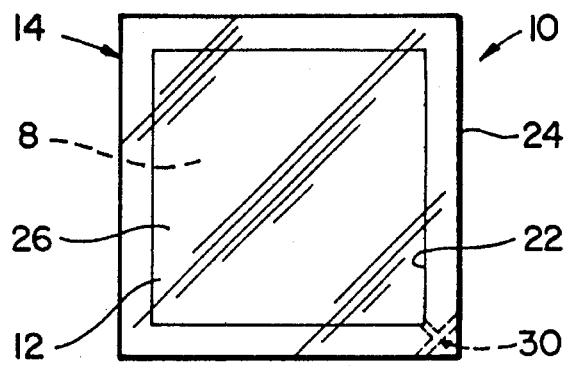
FIG_1
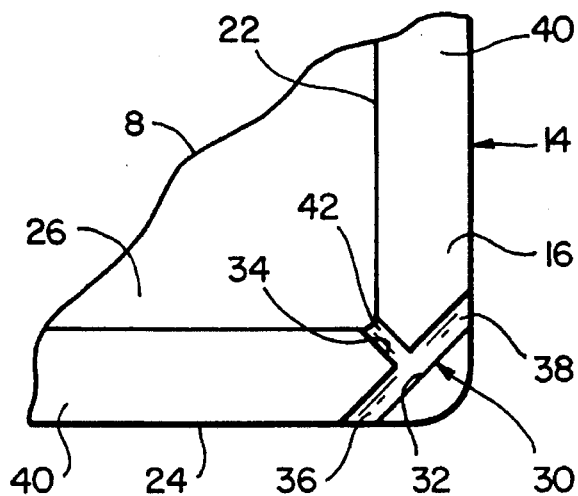
FIG_2
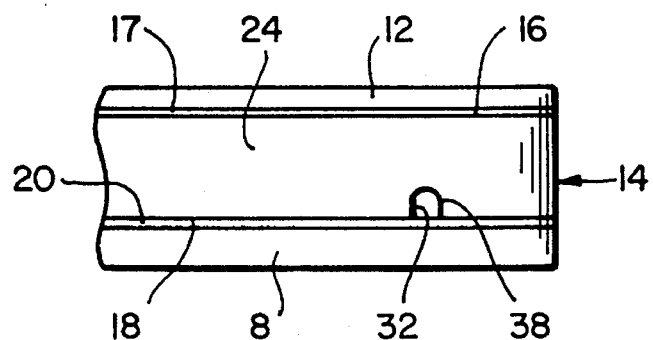
FIG_3

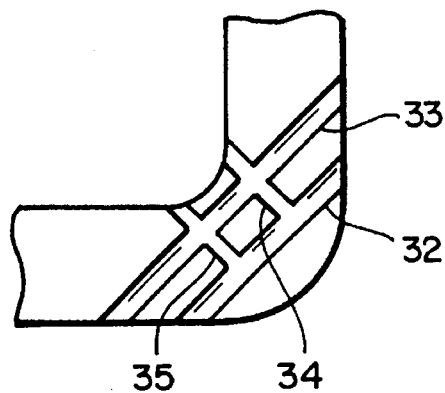
FIG_4
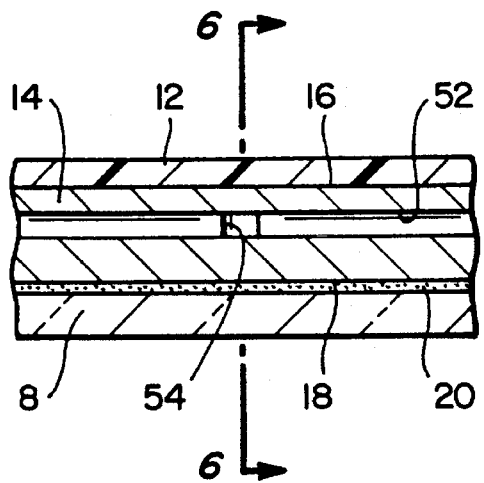
FIG_5
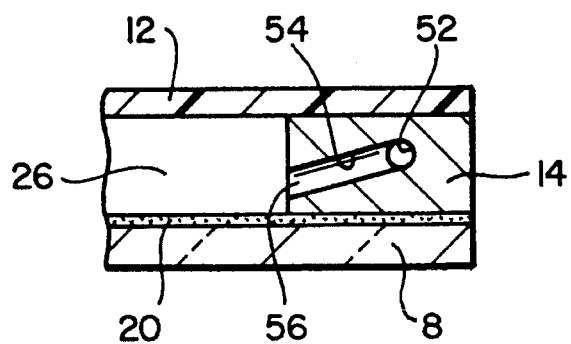
FIG_6

PELLICLE ASSEMBLY WITH VENT STRUCTURE

BRIEF DESCRIPTION OF THE INVENTION

This invention relates in general to pellicles for protecting photomasks and reticles and, more particularly, to a pellicle for isolating a photomask pattern from particulate contaminants.

BACKGROUND OF THE INVENTION

Photomasks, reticles and the like are typically protected from particulate contamination during fabrication by a pellicle which forms a hermetic seal around the patterns on photomask. The pellicle isolates the photomask pattern and the focal plane of the pattern from ambient dust or other foreign particles, ensuring such foreign substances are not reproduced on the semiconductor wafer during transfer of the photomask pattern to the substrate. Generally, the pellicle includes a thin protective optical membrane or film stretched across a rigid peripheral frame which may be mounted to the surface of the photomask. The pellicle film has transmissive properties which allow the passage of ultraviolet light, electromagnetic radiation and the like when the pelliclized photomask is used in the fabrication of integrated circuits. The pellicle isolates the photomask pattern from dust or other foreign matter during fabrication, and is often left on the photomask to provide continuous protection against the collection of such contaminants when the photomask is not in use.

In addition to protecting the photomask from particulate contamination, the hermetic seal between the pellicle and the photomask prevents the exchange of gases between the atmosphere and the interior cavity beneath the pellicle. When the covered photomask is subjected to changes in temperature or pressure such as when the photomask is transported to a different altitude, the difference in pressure between the interior cavity between the pellicle and the photomask and the atmosphere outside of the pellicle may rupture or damage the protective membrane. When the pellicle membrane ruptures, the photomask may be exposed to dust and other foreign particles in the environment as well as pieces of the ruptured pellicle. A pellicle which provides for the exchange of gases between the interior cavity beneath the pellicle and the atmosphere without introducing particulate matter to the photomask pattern would allow the pressure within the interior cavity to equalize with the atmosphere, preventing rupture or damage of the pellicle membrane.

U.S. Pat. No. 4,833,051 discloses a pellicle frame with a vent in the form of a hole extending through the frame and a filter optionally covering the hole. U.S. Pat. No. 5,344,677 to Hong discloses a pellicle having a longitudinally extending channel. A first opening connects the channel with the interior of the pellicle while a second opening contacts the other end of the channel with the atmosphere surrounding the pellicle. A vent structure which provides for the exchange of gaseous substances between the interior and exterior of the pellicle while isolating the interior cavity beneath the protective film from particulate contamination is desirable. Furthermore, a pellicle with a vent structure which may be efficiently manufactured is also desirable.

OBJECTS AND SUMMARY OF THE INVENTION

It is a primary object of this invention to provide a pellicle for protecting photomasks, reticles and the like from particulate contaminants.

It is an additional object of the invention to provide a pellicle in which the pellicle film is protected from becoming damaged or ruptured when the pelliclized photomask is exposed to changes in temperature or pressure.

It is another object of this invention to provide a pellicle with a vent structure providing for the exchange of gaseous substances between the atmosphere and the cavity beneath the pellicle.

It is yet another object of the present invention to provide a pellicle with a vent structure configured to remove particulate contaminants from the gaseous substances entering the cavity beneath the pellicle, isolating the interior cavity from the foreign matter and dust particles in the atmosphere.

A more general object of the invention is to provide a pellicle which may be efficiently and economically manufactured, stored and applied to and removed from photomask surfaces.

In summary, this invention provides a pellicle with a vent structure which is particularly suitable for protecting photomasks, reticles and the like from dust particles, foreign materials and other particulate contaminants. The pellicle includes a peripheral frame having an inner surface defining an interior of the frame, an outer surface, and spaced upper and lower edges joining the inner and outer surfaces. A protective, optical membrane which transmits ultraviolet light or other suitable electromagnetic radiation extends across the interior of the frame and is mounted to the upper edge of the frame. The lower edge of the frame is mountable to the photomask.

Gaseous substances may enter or exit the cavity between the protective membrane and the photomask by passing through at least one vent structure formed in the frame. The vent structure is configured for trapping or removing particulate contaminants from the gaseous substance before the gaseous substance flows into the frame interior. The vent structure includes at least one exterior passageway extending between two outer openings formed in the outer surface of the frame and at least one interior passageway extending inwardly from the exterior passageway to an opening formed in the inner surface of the frame.

Additional objects and features of the invention will be more readily apparent from the following detailed description and appended claims when taken in conjunction with the drawings.

BRIEF DESCRIPTION OF THE DRAWINGS

FIG. 1 is a top plan view of a pellicle in accordance with the invention, shown mounted to a photomask.

FIG. 2 is an enlarged bottom plan view, partially broken away, of the pellicle of FIG. 1.

FIG. 3 is an enlarged partial end view, partially broken away, of the pellicle and photomask of FIG. 1.

FIG. 4 is an enlarged bottom plan view, partially broken away, of another embodiment of the invention.

FIG. 5 is an enlarged cross sectional view of another embodiment of the invention taken substantially along the line of the exterior passageway.

FIG. 6 is an enlarged sectional view taken substantially along the line 6—6 of FIG. 5.

DETAILED DESCRIPTION OF THE INVENTION

Reference will now be made in detail to the preferred embodiment of the invention, which is illustrated in the accompanying figures. Turning now to the drawings, wherein like components are designated by like reference numbers throughout the various figures, attention is directed to FIGS. 1–3.

FIGS. 1–3 show a pellicle which is particularly suitable for isolating a surface, for example a photomask 8, from particulate contaminants including dust particles and other foreign matter. Pellicle 10 generally includes a thin, protective optical membrane 12 stretched across and secured to a peripheral frame 14. The frame 14 is mounted to the photomask 8, enclosing the photomask pattern (not shown) within the cavity inside of the optical membrane 12 and frame 14. By isolating the photomask and focal plane of the pattern from particle contaminants, the pellicle 10 ensures such foreign substances are not reproduced on the semiconductor wafer during transfer of the photomask pattern to the substrate.

The optical membrane 12 may be formed of any suitable material which is designed to pass the ultraviolet light or other electromagnetic radiation used to form the pattern of the photomask on the substrate. Suitable materials for optical membrane 12 include nitrocellulose, cellulose acetate, deep UV films, and the like. The thickness of the optical membrane is generally within the range of 0.8 μm to 3.0 μm. If desired, one or more layers of antireflective coating may be applied to the membrane 12.

Optical membrane 12 is mounted to the upper edge 16 of the peripheral frame 14. In the embodiment shown in FIGS. 1–3, the optical membrane 12 is bonded or adhered to upper edge 14 using an adhesive material 17 suitable for forming a permanent, hermetic seal between the upper edge 14 of the frame and the optical membrane. As shown particularly in FIG. 3, the lower edge 18 of the peripheral frame is mounted to the photomask 8 by an adhesive layer, generally designated 20. Adhesive layer 20 provides a substantially air tight seal between lower edge 18 of the frame and the photomask 8, preventing gaseous substances from seeping between the pellicle 10 and the photomask. The adhesive layer 20 provides a temporary bond between lower edge 18 and photomask 8 so that the pellicle 10 may be easily removed from the photomask without damaging the photomask, the photomask pattern or the pellicle. Preferably, the adhesive layer 20 is permanently applied to the lower edge 18 of the frame 14, with the adhesive layer engaging the exposed surface when pellicle 10 is positioned on photomask 8 and optionally securing the frame 14 to a protective cover (not shown) when the pellicle 10 is separated from photomask 8. However, if desired the adhesive layer may be separately applied to the photomask.

Peripheral frame 14 has an inner surface 22 and an outer surface 24 joining the upper and lower edges 16 and 18. The inner and outer surfaces 22 and 24 are of sufficient height so that any dust particles or other foreign matter collecting on the outer surface of optical membrane 12 are positioned outside of the focal plane of the pattern on photomask 8 during the fabrication of semiconductor devices. In the present embodiment, frame 14 is generally rectangular in shape. However, it is to be understood that in other embodiments of the invention the frame may have a polygonal, circular or oval shape as desired. The frame 14 is preferably formed of a substantially rigid material, such as aluminum.

When pellicle 10 is mounted to the photomask, the photomask pattern is enclosed within an interior cavity 26 defined by the optical membrane 12, inner surface 22, and photomask 8. The interior cavity 26 surrounds the photomask pattern in an environment which is substantially free of dust, foreign matter and other particulate contaminants. The air-tight seals between the membrane 12 and upper edge 16 of the frame, and the lower edge 18 and photomask 8 substantially prevent gaseous substances from seeping around the peripheral frame 14 and carrying particulate contaminants into the interior cavity 26. Although the upper and lower edges of peripheral frame 14 are substantially sealed to the membrane and photomask, interior cavity 26 is not entirely sealed within pellicle 10. Pellicle 10 includes a vent structure, generally designated 30, formed in peripheral frame 14 for the exchange of gaseous substances between interior cavity 26 and the atmosphere outside of pellicle 10.

Vent structure 30 is generally comprised of a plurality of intersecting passageways formed in the frame. As shown in FIGS. 2 and 3, in the present embodiment vent structure 30 includes an exterior passageway 32 extending through the frame between two spaced openings 36 and 38 formed in the outer surface 24 of the frame. An interior passageway 34 extends between the exterior passageway 32 and an inner opening 42 formed in the inner surface 22 of the frame, providing vent structure 30 with a generally T-shaped configuration. As is shown in FIG. 4, the vent structure 30 may include additional passageways such as exterior passageway 33 and interior passageway 35. It will be understood that the number and configuration of the passageways is subject to considerable variation. These additional passageways would preferably cooperate with the exterior and interior passageways 32 and 34 to provide a vent for pellicle 10.

Preferably, passageway 32 is larger in diameter than the interior passageway 34. In the present embodiment, exterior passageway 32 preferably has a diameter of about 5 mil to 6 mil, while interior passageway 34 preferably has a diameter no greater than 3 mil, for example 2 mil to 3 mil. Passageway 32 shown in FIGS. 1–3 extends between two sides 40 of the rectangular shaped frame. In other embodiments of the invention, the exterior passageway may extend between two sides of a polygonal shaped frame or between two circumferentially spaced openings formed in the outer surface of a circular or oval shaped frame. Passageways 32 and 34 are substantially linear in the embodiment shown in FIGS. 1–3, with passageway 34 being substantially perpendicular to the exterior passageway 32. However, it will be understood that the passageways 32 and 34 may have other configurations if desired.

In the embodiment shown in FIGS. 1–3, the exterior and interior passageways 32 and 34 are defined by a pair of channels or grooves formed in the lower edge 18 of peripheral frame 14. However, passageways 32 and 34 may also be defined by holes formed through the body of the peripheral frame by drilling, machining, or other suitable means. In addition, in some applications it may be desirable to form the channels or grooves in the upper edge 16 of the peripheral frame. When the pellicle is assembled, adhesive 20 provides a ceiling enclosing the channels formed in the lower edge of the frame. If desired, the passageways may also be coated with an adhesive substance.

Vent structure 30 is configured to permit the exchange of gaseous substances between the interior cavity 26 and the atmosphere outside of the pellicle 10. The vent structure 30 isolates the interior cavity from particulate contamination by removing the particles from gaseous substances before they enter the interior cavity. The configuration of the passageways 32 and 34 and the adhesive material 20 trap the particles or foreign matter in the vent structure. Preferably, the vent structure 30 prevents dust or other foreign particles having a size of approximately 0.1 microns or greater from entering the interior cavity 26 between the pellicle 10 and the photomask.

Allowing gaseous substances to flow between the cavity 26 and the surrounding environment protects the pellicle 10 against a change in pressure which may damage or rupture optical membrane 12. For example, when the pellicle 10 and photomask 8 are heated or moved to a higher elevation, increasing the pressure of the interior cavity 26 relative to the surrounding atmosphere, a portion of the gaseous substance within the interior cavity may escape through exterior and interior passageways 32 and 34. The vent structure 30 relieves the pressure within interior cavity 26 before optical membrane 12 ruptures or becomes damaged.

If the pressure of interior cavity 26 is less than that of the surrounding atmosphere, air or another gaseous substance may flow through the vent structure 30 into the cavity 26 to equalize the pressure of the cavity and the atmosphere. The gaseous substance enters the exterior passageway 32 through one or both of the openings in the outer surface 24, for example opening 36. As the gaseous substance passes through the passageway 32, the particulate contaminants carried by the gaseous substance is trapped in the exterior passageway 32 before the gaseous substance travels through the interior passageway 34 to the interior cavity 26. Thus, passageways 32 and 34 of the vent structure 30 substantially isolate internal cavity 26 from particulate contaminants.

As is illustrated by the embodiment shown in FIGS. 4 and 5, exterior and interior passageways 52 and 54 may extend through the body of the peripheral frame 14. The exterior passageway 52 extends through the frame 14 at a position intermediate the upper and lower edges 16 and 18 of the peripheral frame. As shown particularly in FIG. 5, the interior passageway 54 extends from exterior passageway 52 to an inner opening 56 spaced above the elevation of the exterior passageway. If desired, a filter may be disposed in one or both of the passageways. The passageways 52 and 54 may also be coated with an adhesive material. Gaseous substances travel through the exterior and interior passageways 52 and 54 to pass between the interior cavity 26 and the atmosphere outside of the pellicle.

With the vent structure of the present invention, pellicle 10 may be subjected to changes in temperature and pressure without rupturing the optical membrane or damaging the pellicle or photomask. While gaseous substances may travel between the interior cavity 26 and the exterior of the pellicle, the vent structure removes particulate contaminants from the gaseous substances passing through the passageways. Thus, the interior cavity between the pellicle and the photomask remains substantially free of dust matter and other foreign particles.

What is claimed is:

1. A pellicle for isolating a selected surface from particulate contaminants comprising:

a peripheral frame having an inner surface defining an interior of said frame, an outer surface, and spaced first and second edges joining said inner and outer surfaces, said first edge of said frame being mountable to said selected surface and said second edge of said frame being mountable to an optical membrane, and at least one vent structure formed in said frame for passage of a gaseous substance between said interior of said frame and the atmosphere outside of said frame, said vent structure being configured for the removal of said particulate contaminants from said gaseous substance before said gaseous substance flows into said interior of said frame, said vent structure including at least one exterior passageway extending between a pair of spaced outer openings in said outer surface of said frame, and at least one interior passageway extending inwardly from said exterior passageway to an inner opening in said inner surface of said frame.

2. The pellicle of claim 1 in which at least one of said exterior passageway and said interior passageway is formed in one of said edges of said frame.

3. The pellicle of claim 1 in which said exterior passageway and said interior passageway are formed in one of said edges of said frame.

4. The pellicle of claim 1 in which at least one of said exterior passageway and said interior passageway is formed in said first edge of said frame.

5. The pellicle of claim 1 in which said frame is a polygon having a first side and a second side joined to said first side, and in which said first outer opening is in said first side of said frame and said second outer opening is in said second side of said frame.

6. The pellicle of claim 1 in which at least one of said exterior passageway and said interior passageway is substantially linear.

7. The pellicle of claim 1 in which said interior passageway is substantially perpendicular to said exterior passageway.

8. The pellicle of claim 1 in which said vent structure includes a second exterior passageway extending between outer openings in said outer surface of said frame.

9. The pellicle of claim 1 in which said vent structure includes a second interior passageway extending between said exterior passageway and an inner opening in said inner surface of said frame.

10. The pellicle of claim 1 in which at least one of said exterior passageway and said interior passageway is coated with an adhesive substance.

11. The pellicle of claim 1, and further comprising an optical membrane mounted to said second edge and extending across said interior of said frame.

12. The pellicle of claim 1, and further comprising an adhesive substance applied to at least a portion of said second edge of said frame.

13. A pellicle for isolating a selected surface from particulate contaminants comprising:

a peripheral frame having an inner surface defining an interior of said frame, an outer surface, and spaced upper and lower edges extending between said inner and outer surfaces, said lower edge of said frame being mountable to said selected surface, a protective membrane mounted to said upper edge of said frame and extending across said interior of said frame, and at least one interior groove and at least one exterior groove formed in at least one of said upper and lower edges of said frame for passage of a gaseous substance between said interior of said frame and the atmosphere outside of said frame when said lower edge is mounted to said selected surface, said grooves being configured for substantially removing said particulate contaminants from said gaseous substance before said gaseous substance enters said interior of said frame, said exterior groove extending between a pair of outer openings formed in said outer surface and said interior groove extending inwardly from said exterior groove to an inner opening formed in said inner surface of said frame.

14. The pellicle of claim 13 in which said interior and exterior grooves are formed in said upper edge of said frame.

15. The pellicle of claim 13 in which said frame is a polygon having a first side and a second side joined to said first side, and in which one of said outer openings is in said first side of said frame and the other of said outer openings is in said second side of said frame.

16. The pellicle of claim 13 in which at least one of said interior and exterior grooves are substantially linear.

17. The pellicle of claim 13 in which said interior groove is substantially perpendicular to said exterior groove.

18. The pellicle of claim 13, and further comprising an adhesive substance applied to at least a portion of said second edge of said frame.

* * * * *